United States Patent
Kim

(10) Patent No.: US 9,954,066 B2
(45) Date of Patent: Apr. 24, 2018

(54) SEMICONDUCTOR DEVICES AND FABRICATING METHODS THEREOF

(71) Applicant: Samsung Electronics Co., Ltd., Suwon-si, Gyeonggi-do (KR)

(72) Inventor: Ju-Youn Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/394,865

(22) Filed: Dec. 30, 2016

(65) Prior Publication Data

US 2017/0110547 A1    Apr. 20, 2017

Related U.S. Application Data

(63) Continuation of application No. 14/168,028, filed on Jan. 30, 2014, now Pat. No. 9,536,878.

(30) Foreign Application Priority Data

May 31, 2013  (KR) .......................... 10-2013-0062804

(51) Int. Cl.
 *H01L 27/08* (2006.01)
 *H01L 29/40* (2006.01)
 *H01L 29/78* (2006.01)
 *H01L 29/06* (2006.01)
 *H01L 29/08* (2006.01)
 *H01L 29/10* (2006.01)
 (Continued)

(52) U.S. Cl.
 CPC ........ *H01L 29/408* (2013.01); *H01L 27/0924* (2013.01); *H01L 27/1104* (2013.01); *H01L 27/1116* (2013.01); *H01L 29/0649* (2013.01); *H01L 29/0847* (2013.01); *H01L 29/1037* (2013.01); *H01L 29/161* (2013.01); *H01L 29/20* (2013.01); *H01L 29/4966* (2013.01); *H01L 29/66545* (2013.01); *H01L 29/7848* (2013.01); *H01L 29/7851* (2013.01)

(58) Field of Classification Search
 CPC ........................ H01L 29/0649; H01L 27/0886
 See application file for complete search history.

(56) References Cited

U.S. PATENT DOCUMENTS 7,148,548 B2   12/2006   Doczy et al.
7,902,610 B2    3/2011   Tai et al.
(Continued)

FOREIGN PATENT DOCUMENTS

CN       102244098        11/2011
JP       2001-024065       1/2001
KR       1020020002094 A   1/2002

OTHER PUBLICATIONS

Chinese Office Action for Chinese Application No. 201410225077.9, dated Feb. 2, 2018.

*Primary Examiner* — Tran Tran
(74) *Attorney, Agent, or Firm* — Myers Bigel, P.A.

(57) ABSTRACT

Provided are semiconductor devices and fabricating methods thereof. The semiconductor device includes a field insulating layer formed in a substrate, an interlayer dielectric layer formed on the field insulating layer and including a trench exposing at least a portion of the field insulating layer, a deposition insulating layer formed in the trench to be disposed on the field insulating layer, a gate insulating layer formed the trench to be disposed on the deposition insulating layer, and a metal gate formed the trench on the gate insulating layer.

12 Claims, 16 Drawing Sheets

(51) Int. Cl.
*H01L 29/49* (2006.01)
*H01L 29/20* (2006.01)
*H01L 29/161* (2006.01)
*H01L 27/092* (2006.01)
*H01L 27/11* (2006.01)
*H01L 29/66* (2006.01)

(56) References Cited

U.S. PATENT DOCUMENTS

| | | |
|---|---|---|
| 8,129,795 B2 | 3/2012 | Datta et al. |
| 8,288,296 B2 | 10/2012 | Wong et al. |
| 8,334,198 B2 | 12/2012 | Chen et al. |
| 2006/0071275 A1 | 4/2006 | Brask et al. |
| 2009/0051008 A1 | 2/2009 | Shin et al. |
| 2010/0244110 A1* | 9/2010 | Kim .................. H01L 27/10817 257/296 |
| 2011/0189845 A1 | 8/2011 | Yamakawa |
| 2012/0052641 A1 | 3/2012 | Lee et al. |
| 2012/0091540 A1 | 4/2012 | Cheng et al. |
| 2012/0135577 A1 | 5/2012 | Lee et al. |
| 2012/0261754 A1 | 10/2012 | Cheng et al. |
| 2012/0261758 A1 | 10/2012 | Lee et al. |
| 2012/0292708 A1 | 11/2012 | Chen et al. |
| 2012/0319216 A1 | 12/2012 | Song et al. |
| 2014/0183642 A1 | 7/2014 | Liang et al. |

* cited by examiner

<u>10</u>

11

SEMICONDUCTOR DEVICES AND FABRICATING METHODS THEREOF

CROSS-REFERENCE TO RELATED APPLICATION

This U.S. non-provisional patent application claims priority as a continuation application of U.S. patent application Ser. No. 14/168,028, filed Jan. 30, 2014, which, in turn, claims priority from Korean Patent Application No. 10-2013-0062804 filed on May 31, 2013 in the Korean Intellectual Property Office, and all the benefits accruing therefrom under 35 U.S.C. 119. The disclosure of each of the above-identified patent applications is hereby incorporated herein by reference in its entirety.

BACKGROUND

As the feature size of a metal oxide semiconductor (MOS) transistor has been reduced, the length of a gate and the length of a channel formed therebelow are also gradually decreasing. Accordingly, various studies are under way to increase capacitance between the gate and the channel and to improve operating characteristics of the MOS transistor.

As a thickness of a silicon oxide film mainly used as a gate insulating film is gradually reduced, the silicon oxide film may experience physical limitations in its electrical property. Therefore, in order to replace the conventional silicon oxide film, research into a high-k film having a high dielectric constant is actively being conducted. The high-k film may reduce leakage current between a gate electrode and a channel region while maintaining a small thickness of an equivalent oxide film.

Polysilicon mainly used as a gate material may have higher resistance than most metals. Accordingly, the current tendency is to replace the polysilicon gate electrode with a metal gate electrode.

SUMMARY

Some embodiments of the present inventive concept provide semiconductor devices using a deposition insulating layer to prevent a residue from being generated during a fabrication process.

Some embodiments of the present inventive concept also provide fabricating methods of a semiconductor device using a deposition insulating layer to prevent a residue from being generated during a fabrication process.

These and other objects of the present inventive concept will be described in or be apparent from the following description of the example embodiments.

According to an aspect of the present inventive concept, there is provided a semiconductor device including a field insulating layer formed in a substrate, an interlayer dielectric layer formed on the field insulating layer and including a trench exposing at least a portion of the field insulating layer, a deposition insulating layer formed in the trench to be disposed on the field insulating layer, a gate insulating layer formed the trench to be disposed on the deposition insulating layer, and a metal gate formed the trench on the gate insulating layer.

According to another aspect of the present inventive concept, there is provided a semiconductor device including a field insulating layer, an interlayer dielectric layer formed on the field insulating layer and including a trench exposing at least a portion of the field insulating layer, an oxide film making contact with the field insulating layer and formed in the trench, and a metal gate formed the trench on the oxide film.

According to still another aspect of the present inventive concept, there is provided a fabricating method of a semiconductor device, the fabricating method including forming a field insulating layer in a substrate, forming an interlayer dielectric layer on the field insulating layer, the interlayer dielectric layer including a trench exposing at least a portion of the field insulating layer, forming a deposition insulating layer in the trench to be disposed on the field insulating layer, forming a gate insulating layer in the trench to be disposed on the deposition insulating layer, and forming a metal gate in the trench to be disposed on the gate insulating layer.

According to a further aspect of the present inventive concept, there is provided a fabricating method of a semiconductor device, the fabricating method including forming an interlayer dielectric layer including a first trench and a second trench on a substrate, forming a deposition insulating layer on sidewalls and a bottom surface of the first trench, on sidewalls and a bottom surface of the second trench and on a top surface of the interlayer dielectric layer, sequentially forming a high-k material layer and a metal layer in the first trench and the second trench to be disposed on the deposition insulating layer, and planarizing the metal layer, the high-k material layer and the deposition insulating layer.

According to another aspect of the present inventive concept, there is provided a fabricating method of a semiconductor device, the fabricating method including providing a substrate having a first region and a second region defined therein, forming a first sacrificial insulating pattern and a first sacrificial gate pattern in the first region and a second sacrificial insulating pattern and a second sacrificial gate pattern in the second region, forming an interlayer dielectric layer in the vicinity of the first sacrificial insulating pattern, the first sacrificial gate pattern, the second sacrificial insulating pattern and the second sacrificial gate pattern, removing the second sacrificial insulating pattern, the first sacrificial gate pattern and the second sacrificial gate pattern, and forming a first gate insulating layer and a first metal gate in the first trench and a second gate insulating layer and a second metal gate in the second trench to be disposed on the first sacrificial insulating pattern.

According to still another aspect of the present inventive concept, there is provided a semiconductor device including a first fin and a second fin formed on a substrate lengthwise to be parallel to each other, a field insulating layer disposed between the first fin and the second fin on the substrate, an interlayer dielectric layer formed on the first fin, the second fin and the field insulating layer and including a first trench exposing a portion of the first fin and a second trench exposing a portion of the field insulating layer, a first normal gate formed in the first trench, and a deposition insulating layer formed in the second trench to be disposed on the field insulating layer, a gate insulating layer formed in the second trench to be disposed on the deposition insulating layer, and a dummy gat formed in the second trench to be disposed on the gate insulating layer.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1:
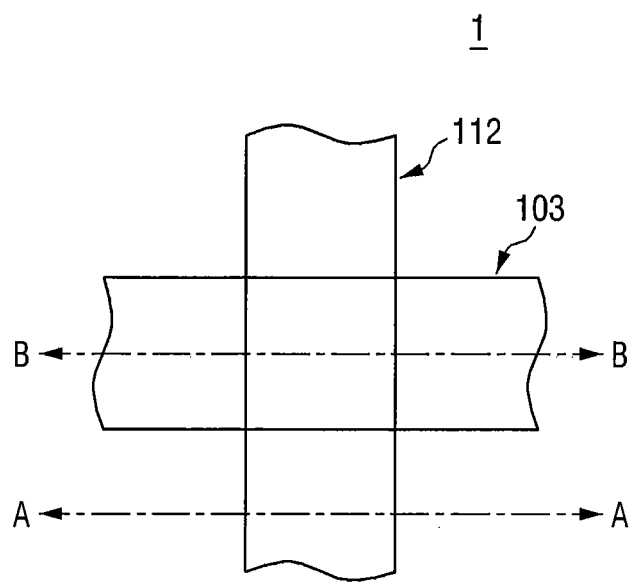
FIG. 1 is a layout view of a semiconductor device according to some embodiments of the present inventive concept.

Advantages and features of the present inventive concept and methods of accomplishing the same may be understood more readily by reference to the following detailed description of example embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross-sectional views, and/or plan views, in which example embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 2:
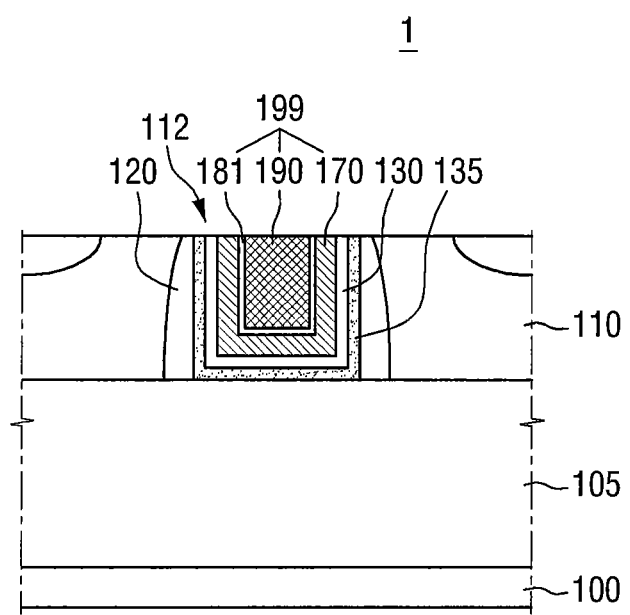
FIG. 2 is a cross-sectional view taken along the line A-A of FIG. 1
Figure 3:
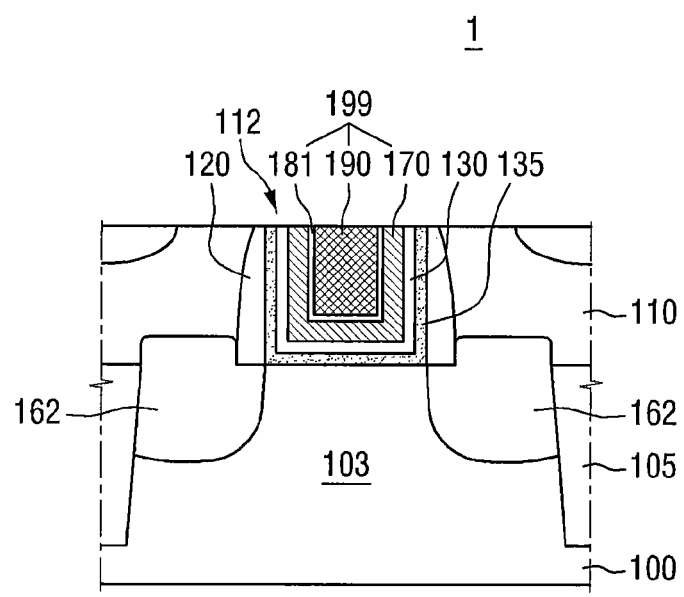
FIG. 3 is a cross-sectional view taken along the line B-B of FIG. 1.

FIG. 1 is a layout view of a semiconductor device according to some embodiments of the present inventive concept, FIG. 2 is a cross-sectional view taken along the line A-A of FIG. 1 and FIG. 3 is a cross-sectional view taken along the line B-B of FIG. 1. Here, a gate structure of an N type transistor is exemplified as the semiconductor device shown in FIG. 1.

Referring to FIGS. 1 to 3, the semiconductor device 1 according to some embodiments of the present inventive concept includes a substrate 100, a field insulating layer 105, an interlayer dielectric layer 110 including a first trench 112, a first deposition insulating layer 135, a first gate insulating layer 130, and a first metal gate 199. The first metal gate 199 may include an N type work function control film 170, a first adhesive film 181, and a first metal gate pattern 190. The first metal gate 199 may be formed by a replacement process.

The field insulating layer 105, such as a shallow trench isolation (STI) film, may be formed in the substrate 100 to define an active region 103. The active region 103 may extend lengthwise in a first direction, as shown in FIG. 1, but aspects of the present inventive concept are not limited thereto. The substrate 100 may be made of one or more semiconductor materials selected from the group consisting of, for example, Si, Ge, SiGe, GaP, GaAs, SiC, SiGeC, InAs and InP. In some embodiments, the substrate 10 may be a silicon on insulator (SOI) substrate. In addition, the substrate 100 may be a III-V group substrate. A channel of the first metal gate 199 may include a SiGe channel. As will later be described, when the substrate 100 is a III-V or the channel is a SiGe channel, not a Si channel, an oxidation method may not be employed to form a silicon oxide film. In this case, like in some embodiments of the present inventive concept, the silicon oxide film may be formed using a deposition method.

The interlayer dielectric layer 110 is formed on the substrate 100 and may include the first trench 112. The interlayer dielectric layer 110 may be formed by stacking two or more insulating layers. As shown, sidewalls of the first trench 112 may contact a spacer 120 and a bottom surface of the first trench 112 may contact the substrate 100, but aspects of the present inventive concept are not limited thereto. As shown in FIG. 1, the first trench 112 may extend lengthwise in a second direction to cross the active region 103, but aspects of the present inventive concept are not limited thereto. Therefore, the first trench 112 may expose at least a portion of the field insulating layer 105 (see FIG. 2) or may expose at least a portion of the active region 103 (see FIG. 3).

The spacer 120 may be formed of at least one of a nitride film and an oxynitride film.

The first deposition insulating layer 135 may be an insulating layer formed by a deposition method. The deposition method may include chemical vapor deposition (CVD) or atomic layer deposition (ALD), but aspects of the present inventive concept are not limited thereto. The first deposition insulating layer 135 may include a silicon oxide film (e.g., HTO), but aspects of the present inventive concept are not limited thereto. Since the first deposition insulating layer 135 is formed by the deposition method, it may be formed on the field insulating layer 105, as shown in FIG. 2. In addition, since the first deposition insulating layer 135 is formed by the deposition method after forming the first trench 112 (see FIG. 20), it may be conformally formed along sidewalls and bottom surface of the first trench 112. When the oxide film is formed by a method different from the deposition method, such as a thermal process, a dual plasma using method, a UV plasma using method, or a peroxide using method, it may not be formed on the field insulating layer 105. In this case, the oxide film may not be formed on sidewalls of the first trench 112, either. The first deposition insulating layer 135 and the field insulating layer 105 may be formed in contact with each other. The first deposition insulating layer 135 may be formed to a thickness of, for example, approximately 50 Å or less (in a range of approximately 5 Å to approximately 50 Å). For example, the first deposition insulating layer 135 may be formed to a thickness of 10 Å. The first deposition insulating layer 135 is used to improve operating characteristics of a high voltage transistor (that is, to increase a breakdown voltage). As will later be described, the oxide film formed by a deposition method can be more easily removed than the oxide film formed by a method different from the deposition method. That is to say, the oxide film formed by the deposition method seldom raises an unstrip issue and leaves little residue. In addition, when the substrate 100 is a group substrate, since silicon is not included in the substrate 100, it is quite difficult to form a silicon insulating layer on the substrate 100 using a thermal process. Therefore, like in the semiconductor device 1 according to the first embodiment of the present inventive concept, the silicon insulating layer can be easily formed using a deposition method.

The first gate insulating layer 130 may be conformally formed along sidewalls and a bottom surface of the first trench 112 on the first deposition insulating layer 135. The first gate insulating layer 130 and the first deposition insulating layer 135 may be disposed to make contact with each other. The first gate insulating layer 130 may include a high-k material having a higher dielectric constant than a silicon oxide film. For example, the first gate insulating layer 130 may include a material selected from the group consisting of $HfO_2$, $ZrO_2$, $Ta_2O_5$, $TiO_2$, $SrTiO_3$ and $(Ba,Sr)TiO_3$. The first gate insulating layer 130 may be formed to an appropriate thickness according to the type of device to be formed. For example, when the first gate insulating layer 130 includes $HfO_2$, it may be formed to a thickness of approximately 50 Å or less (that is, in a range of between approximately 5 Å to 50 Å).

Although not shown, an etch stop film may be formed on the first gate insulating layer 130. The etch stop film may include, for example, at least one of TiN and TaN. For example, the etch stop film may be a stack of TiN and TaN films. The etch stop film may be used in removing a portion of an N type work function control film.

The N type work function control film 170 may be formed on the first gate insulating layer 130 (or the etch stop film) in the first trench 112. As shown, the N type work function control film 170 may also be conformally formed along the sidewalls and bottom surface of the first trench 112. The N type work function control film 170 may control operating characteristics of an N type transistor by controlling a work function of the N type transistor. The N type work function control film 170 may be made of a material selected from the group consisting of TiAl, TiAlC, TiAlN, TaC, TiC, and HfSi. For example, the N type work function control film 170 may be a TiAlC film.

The first adhesive film 181 may be formed on the N type work function control film 170 in the first trench 112. The first adhesive film 181 may include at least one of TiN and Ti. Some embodiments provide that the first adhesive film 181 may include a TiN film and a Ti film sequentially stacked. The first adhesive film 181 may increase adhesion of a first metal gate pattern 190 to be formed later. For example, when the first metal gate pattern 190 includes Al, the first adhesive film 181 may be a single film made of Ti or TiN. When the first metal gate pattern 190 includes W, the first adhesive film 181 may be a single film made of TiN. The first metal gate pattern 190 may be formed in the first trench 112 on the first adhesive film 181 (or on the N type work function control film 170) to fill a portion of the first trench 112. The first metal gate pattern 190 may include at least one selected from the group consisting of aluminum (Al), tungsten (W) and titanium (Ti), but aspects of the present inventive concept are not limited thereto.

Meanwhile, as shown in FIGS. 2 and 3, in the semiconductor device 1 according to some embodiments of the present inventive concept, a stacking order of multiple functional layers of the gate structure formed on the field insulating layer 105 and a stacking order of the multiple functional layers of the gate structure formed on the active region 103 are the same with each other.

That is to say, as shown in FIG. 3, the gate structure formed on the field insulating layer 105 includes a first deposition insulating layer 135, a first gate insulating layer 130 and a first metal gate 199 sequentially stacked one on another. As shown in FIG. 2, the gate structure formed on the active region 103 may also include a first deposition insulating layer 135, a first gate insulating layer 130 and a first metal gate 199 sequentially stacked one on another.

Figure 4:
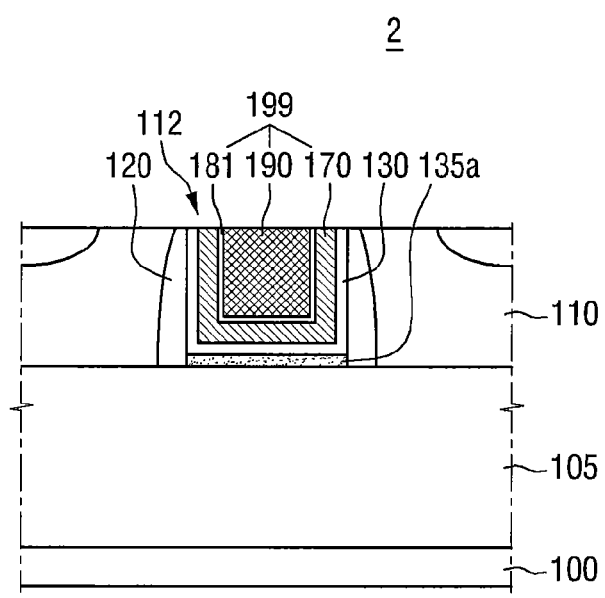
FIG. 4 is a cross-sectional view of a semiconductor device according to some embodiments of the present inventive concept.

FIG. 4 is a cross-sectional view of a semiconductor device according to some embodiments of the present inventive concept. For the sake of convenient explanation, the following description will focus on differences between the present embodiments and the previously described embodiments of the present inventive concept shown in FIGS. 1 to 3.

Referring to FIG. 4, in the semiconductor device 2 according to some embodiments of the present inventive concept, a first deposition insulating layer 135a may be formed only on a bottom surface of the first trench 112 without being formed on sidewalls of the first trench 112. As will later be described, if the first deposition insulating layer 135a is first formed before forming the first trench 112, it may be formed only on the bottom surface of the first trench 112 (see FIG. 22). The first deposition insulating layer 135a may be formed to make contact with the field insulating layer 105.

The first gate insulating layer 130 may be conformally formed along sidewalls and bottom surface of the first trench 112 on the first deposition insulating layer 135. A portion of the first gate insulating layer 130 may make contact with the first deposition insulating layer 135a. As described above, the first gate insulating layer 130 may include a high-k dielectric material having a higher dielectric constant than a silicon oxide film.

Figure 5:
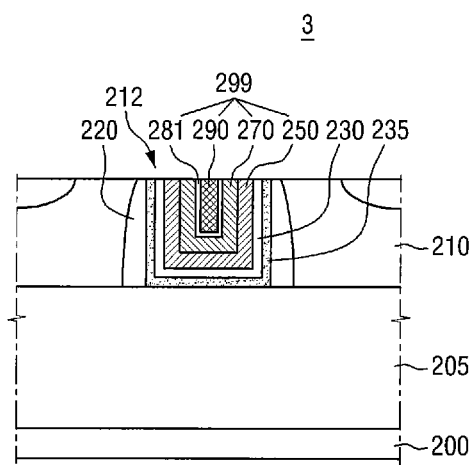
FIG. 5 is a cross-sectional view of a semiconductor device according to some embodiments of the present inventive concept.

FIG. 5 is a cross-sectional view of a semiconductor device according to some embodiments of the present inventive concept. For the sake of convenient explanation, the following description will focus on differences between the present embodiment and the previously described embodiments of the present inventive concept shown in FIGS. 1 to 3. Here, a gate structure of a P type transistor is exemplified as the semiconductor device shown in FIG. 5.

Referring to FIG. 5, the semiconductor device 3 according to the third embodiment of the present inventive concept may include a substrate 200, an interlayer dielectric layer 210 including a second trench 212, a second deposition insulating layer 235, a second gate insulating layer 230, and a second metal gate 299. Here, the second metal gate 299 may include a P type work function control film 250, an N type work function control film 270, a second adhesive film 281 and a second metal gate pattern 290.

The second deposition insulating layer 235 may be conformally formed along sidewalls and a bottom surface of the second trench 212. Since the second deposition insulating layer 235 is formed by a deposition method, it may also be formed on the field insulating layer 105. The second deposition insulating layer 235 and the field insulating layer 205 may be formed to make contact with each other. The deposition method may include chemical vapor deposition (CVD) or atomic layer deposition (ALD), but aspects of the present inventive concept are not limited thereto. The second deposition insulating layer 235 may include a silicon oxide film (e.g., HTO), but aspects of the present inventive concept are not limited thereto.

Meanwhile, although not shown, the second deposition insulating layer 235 may be formed only on the bottom surface of the second trench 212 without being formed on sidewalls of the second trench 212 (see FIG. 4).

The second gate insulating layer 230 may conformally be formed along the sidewalls and bottom surface of second trench 212 on the second deposition insulating layer 235. The second gate insulating layer 230 and the second deposition insulating layer 235 may be formed to make contact with each other.

Although not shown, an etch stop film may be formed on the second gate insulating layer 230.

The P type work function control film 250 may be formed on the second gate insulating layer 230 (or the etch stop film) in the second trench 212. As shown, the P type work function control film 250 may also be conformally formed along the sidewalls and bottom surface of the second trench 212. The P type work function control film 250 may control operating characteristics of a P type transistor by controlling a work function of the P type transistor. For example, the P type work function control film 250 may be a TiN film, but aspects of the present inventive concept are not limited thereto.

The N type work function control film 270 may be formed on the P type work function control film 250 in the second trench 212. If operating characteristics of the P type transistor are not severely impeded, the N type work function control film 270 is not removed but is disposed in the P type transistor, which is for the purpose of using a reduced number of photolithography.

The second adhesive film 281 may be formed on the N type work function control film 270 in the second trench 212.

The second metal gate pattern 290 may be formed on the second adhesive film 281 to fill the second trench 212.

Figure 6:
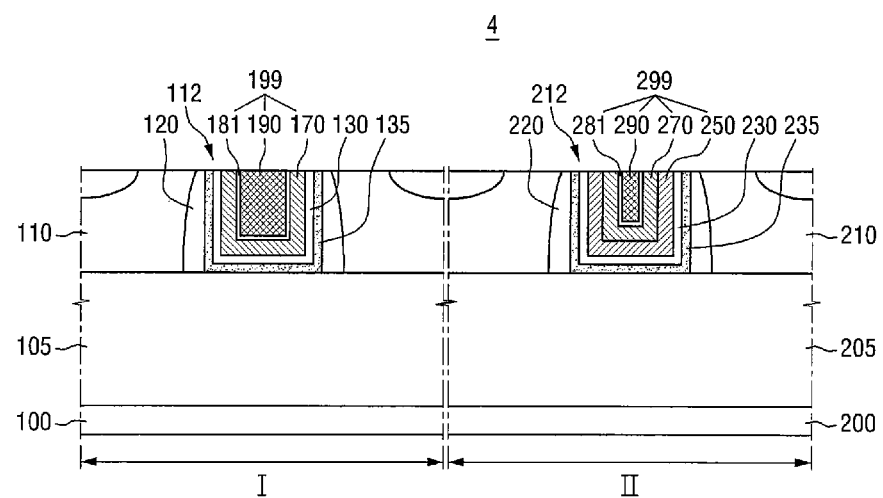
FIG. 6 is a cross-sectional view of a semiconductor device according to some embodiments of the present inventive concept.

FIG. 6 is a cross-sectional view of a semiconductor device according to some embodiments of the present inventive concept.

Referring to FIG. 6, in the semiconductor device 4 according to some embodiments of the present inventive concept, substrates 100 and 200 may include a first region I and a second region II defined therein. At least one of the N type transistors shown in FIGS. 1 to 4 may be formed in the first region I and the P type transistor shown in FIG. 5 may be formed in the second region II. For example, the N type transistor shown in FIG. 2 may be formed in the first region I and the P type transistor shown in FIG. 5 may be simultaneously formed in the second region II.

Figure 7:
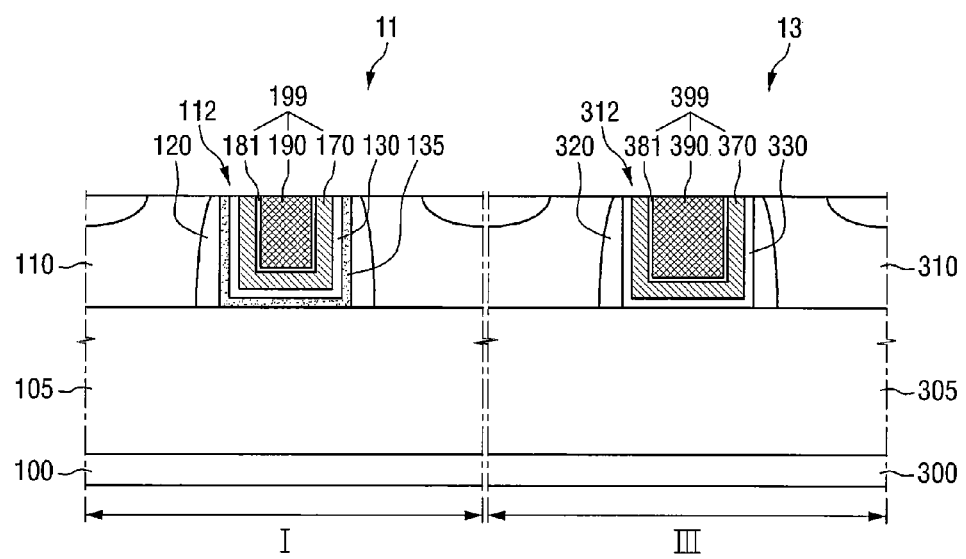
FIG. 7 is a cross-sectional view of a semiconductor device according to some embodiments of the present inventive concept.

FIG. 7 is a cross-sectional view of a semiconductor device according to some embodiments of the present inventive concept.

Referring to FIG. 7, in the semiconductor device 5 according to some embodiments of the present inventive concept, substrates 100 and 300 may include a first region I and a third region III defined therein. A first transistor 11 having a first operating voltage may be formed in the first region I and a third transistor 13 having a third operating voltage different from the first operating voltage may be formed in the third region III. The third operating voltage may be smaller than the first operating voltage. For example, the first operating voltage may be a high voltage and the third operating voltage may be a regular voltage, but aspects of the present inventive concept are not limited thereto. For example, the first operating voltage may be in a range of 1.5 to 1.8V and the third operating voltage may be in a range of 0.8 to 1.0V. In the illustrated embodiment, the first transistor 11 and the third transistor 13 are N type transistors, but aspects of the present inventive concept are not limited thereto.

In the first region I, the first transistor 11 may include a first deposition insulating layer 135, a first gate insulating layer 130 formed on the first deposition insulating layer 135 and a first metal gate 199 formed on the first gate insulating layer 130. In the third region III, the third transistor 13 may include a third gate insulating layer 330 and a third metal gate 399 formed on the third gate insulating layer 330. That is to say, a deposition insulating layer is not present between the third gate insulating layer 330 and the substrate 300 (or the field insulating layer 305).

That is to say, in the first transistor 11, the first deposition insulating layer 135 and the first gate insulating layer 130 are disposed between the first metal gate 199 and the substrate 100. In the third transistor 13, the third gate insulating layer 330 is disposed between the third metal gate 399 and the substrate 300. That is to say, since a sum of thicknesses of the first deposition insulating layer 135 and the first gate insulating layer 130 is relatively large, the first transistor 11 may operate at a high voltage. That is to say, a breakdown voltage of the first transistor 11 may be increased. However, since the thickness of the third gate insulating layer 330 is relatively small, the third transistor 13 may operate at a regular voltage.

The first metal gate 199 may include, for example, an N type work function control film 170, a first adhesive film 181 and a first metal gate pattern 190, but aspects of the present inventive concept are not limited thereto. The third metal gate 399 may include, for example, an N type work function control film 370, a third adhesive film 381 and a third metal gate pattern 390, but aspects of the present inventive concept are not limited thereto.

Figure 8:
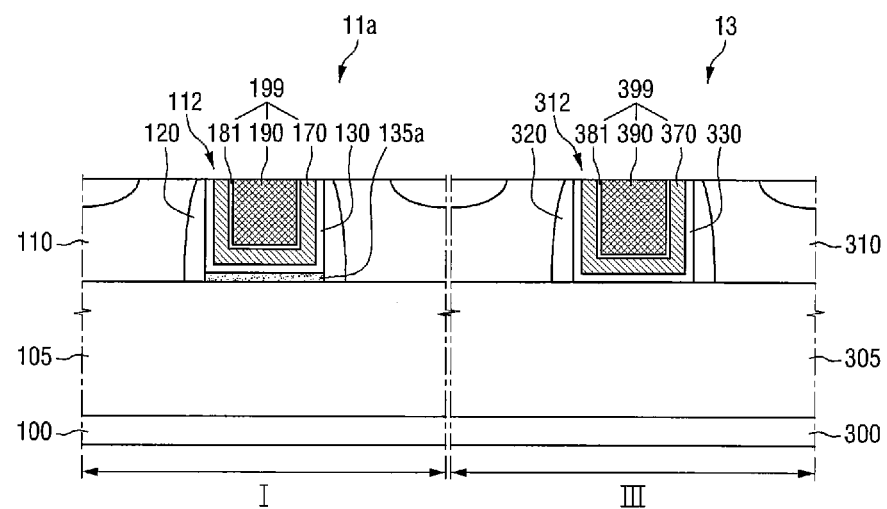
FIG. 8 is a cross-sectional view of a semiconductor device according to some embodiments of the present inventive concept.

FIG. 8 is a cross-sectional view of a semiconductor device according to some embodiments of the present inventive concept. For the sake of convenient explanation, the following description will focus on differences between the present embodiment and the previous embodiment of the present inventive concept shown in FIG. 7.

Referring to FIG. 8, in the semiconductor device 6 according to some embodiments of the present inventive concept, a first transistor 11a is formed in the first region I and a third transistor 13 is formed in the third region III.

The first deposition insulating layer 135a of the first transistor 11a may be formed only on a bottom surface of the first trench 112 without being formed on sidewalls of the first trench 112. If the first deposition insulating layer 135a is first formed before forming the first trench 112, it may be formed only on the bottom surface of the first trench 112 (see FIG. 22). The first deposition insulating layer 135a and the field insulating layer 105 may be formed to make contact with each other.

Figure 9:
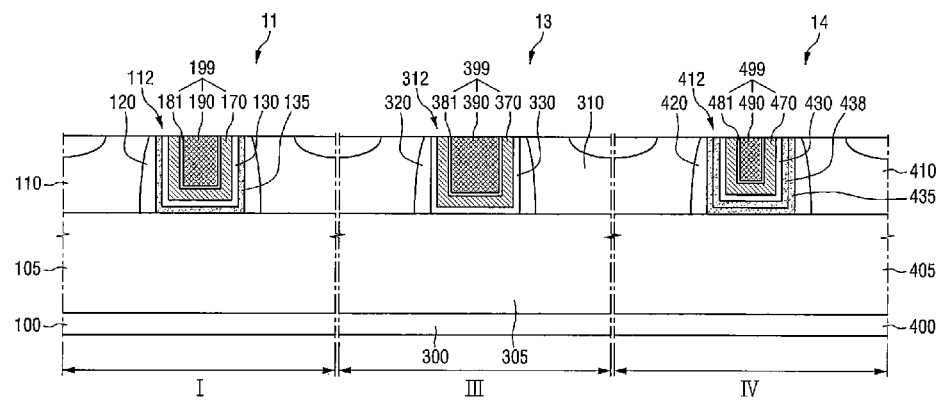
FIG. 9 is a cross-sectional view of a semiconductor device according to some embodiments of the present inventive concept.

FIG. 9 is a cross-sectional view of a semiconductor device according to some embodiments of the present inventive concept. For the sake of convenient explanation, the following description will focus on differences between the present embodiment and the previous embodiment of the present inventive concept shown in FIG. 7.

Referring to FIG. 9, in the semiconductor device 5 according to some embodiments of the present inventive concept, substrates 100, 300 and 400 include a first region I, a third region III and a fourth region IV defined therein. A first transistor 11 having a first operating voltage may be formed in the first region I, a third transistor 13 having a third operating voltage different from the first operating voltage may be formed in the third region III, and a fourth transistor 14 having a fourth operating voltage different from the third operating voltage may be formed in the fourth region IV. The fourth operating voltage may be greater than the first operating voltage and the first operating voltage may be greater than third operating voltage. For example, the fourth operating voltage may be greater than or equal to 3.0V, the first operating voltage may be in a range of 1.5 to 1.8V and the third operating voltage may be in a range of 0.8 to 1.0V. In the illustrated embodiment, the first transistor 11, the third transistor 13 and the fourth transistor 14 are N type transistors, but aspects of the present inventive concept are not limited thereto.

In the first transistor 11, a first deposition insulating layer 135 and a first gate insulating layer 130 may be formed between a first metal gate 199 and the substrate 100 (or a field insulating layer 105).

In the third transistor 13, a third gate insulating layer 330 may be formed between a third metal gate 399 and the substrate 300 (or a field insulating layer 305). That is to say, a deposition insulating layer may not be present between the third metal gate 399 and the substrate 300.

In the fourth transistor 14, fourth and fifth deposition insulating layers 435 and 438 and a fourth gate insulating layer 430 may be formed between a fourth metal gate 499 and the substrate 400 (or a field insulating layer 405). Therefore, since a sum of thicknesses of the fourth and fifth deposition insulating layers 435 and 438 and the fourth gate insulating layer 430 is relatively large, the fourth transistor 14 may operate at a high voltage of 3.0V or greater.

Meanwhile, the first deposition insulating layer 135 of the first transistor 11 may be simultaneously formed with the fourth deposition insulating layer 435 or the fifth deposition insulating layer 438 of the fourth transistor 14, but aspects of the present inventive concept are not limited thereto.

The fourth metal gate 499 may include, for example, an N type work function control film 470, a fourth adhesive film 481 and a fourth metal gate pattern 490, but aspects of the present inventive concept are not limited thereto.

Figure 10:
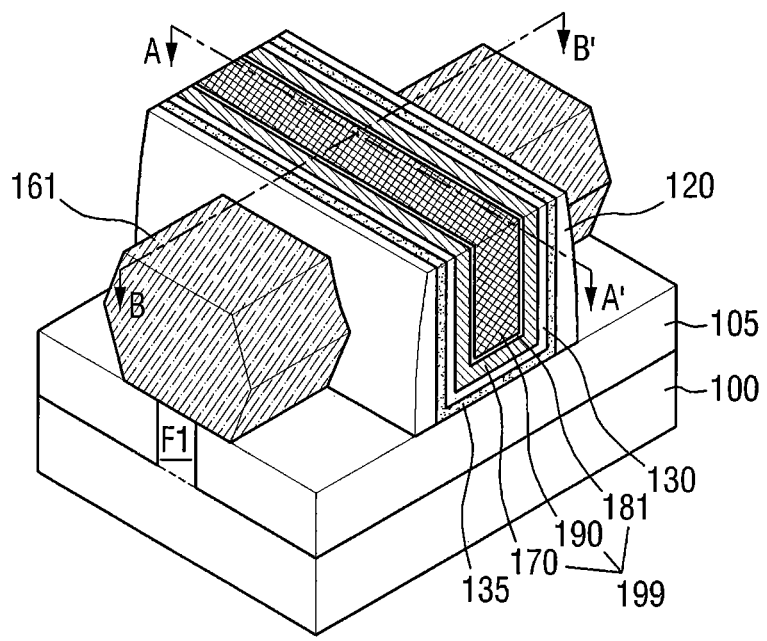
FIG. 10 is a perspective view of a semiconductor device according to an eighth embodiment of the present inventive concept.
Figure 11:
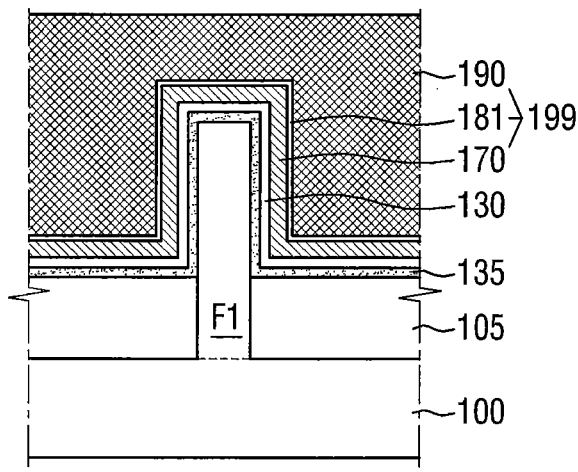
FIG. 11 is a cross-sectional view taken along the line A-A of FIG. 10
Figure 12:
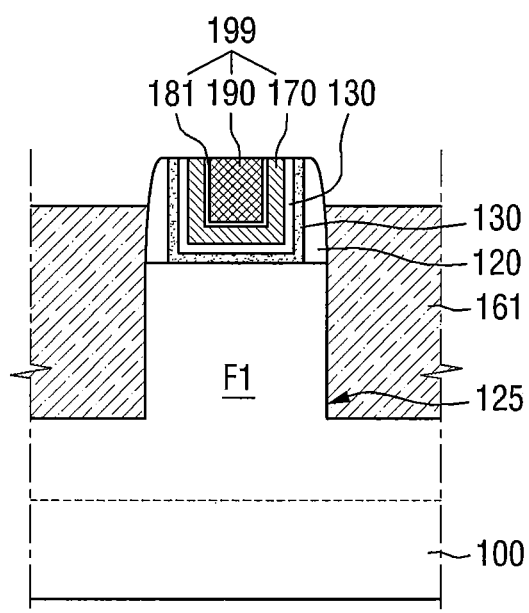
FIG. 12 is a cross-sectional view taken along the line B-B of FIG. 10.

Next, a semiconductor device according to some embodiments of the present inventive concept will be described with reference to FIGS. 10 to 12. FIG. 10 is a perspective view of a semiconductor device according to some embodiments of the present inventive concept, FIG. 11 is a cross-sectional view taken along the line A-A of FIG. 10 and FIG. 12 is a cross-sectional view taken along the line B-B of FIG. 10. FIGS. 10 to 12 illustrate a gate of the N type transistor shown in FIG. 1, which is applied to a fin type transistor (FinFET).

Referring to FIGS. 10 to 12, the semiconductor device 8 according to some embodiments of the present inventive concept may include a fin F1, a first metal gate 199, and a source/drain 161.

The fin F1 may extend lengthwise in a second direction Y1. The fin F1 may be a portion of a substrate 100, and may include an epitaxial layer grown from the substrate 100. A field insulating layer 105 may cover lateral surfaces of the fin F1. The first metal gate 199 may extend in a first direction X1. As shown, the first metal gate 199 may include an N type work function control film 170, a first adhesive film 181 and a first metal gate pattern 190.

The source/drain 161 may be disposed at opposite sides of the first metal gate 199. The source/drain 161 may be an elevated source/drain. That is to say, a top surface of the source/drain 161 may be higher than a bottom surface of the interlayer dielectric layer 110. In addition, the source/drain 161 and the first metal gate 199 may be insulated from each other by a spacer 120.

When the semiconductor device 8 according to some embodiments of the present inventive concept is an N type transistor, the source/drain 161 may include a tensile stress material. The source/drain 161 may include the same material as the substrate 100 or the tensile stress material. For example, when the substrate 100 includes Si, the source/drain 161 may include Si or a material having a smaller lattice constant than Si (e.g., SiC).

Although not shown, some embodiments provide that gates of the P type transistors shown in FIG. 5 may be applied to fin type transistors.

Some embodiments provide that in a case where a gate of a P type transistor (e.g., the gate shown in FIG. 5) is applied to a fin type transistor, the source/drain 161 may include a compressive stress material. For example, the compressive stress material may be a material having a larger lattice constant than silicon (Si), for example, SiGe. The compressive stress material may improve the mobility of carriers of a channel region by applying compressive stress to the fin F1.

Figure 13A:
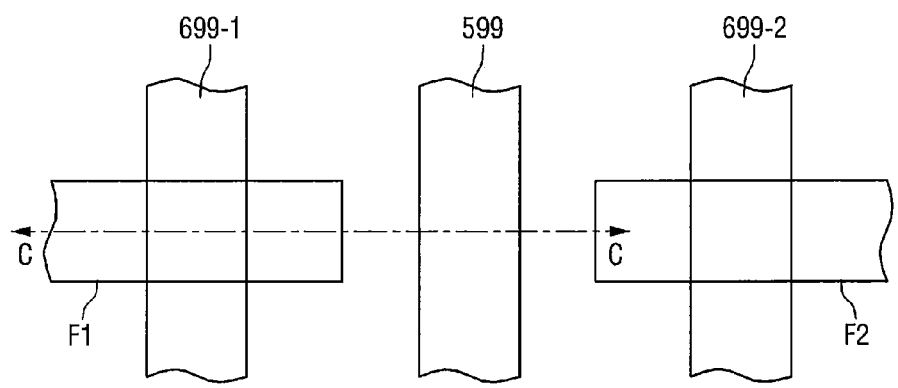
FIGS. 13A to 13D illustrates a semiconductor device according to some embodiments of the present inventive concept.
Figure 13B:
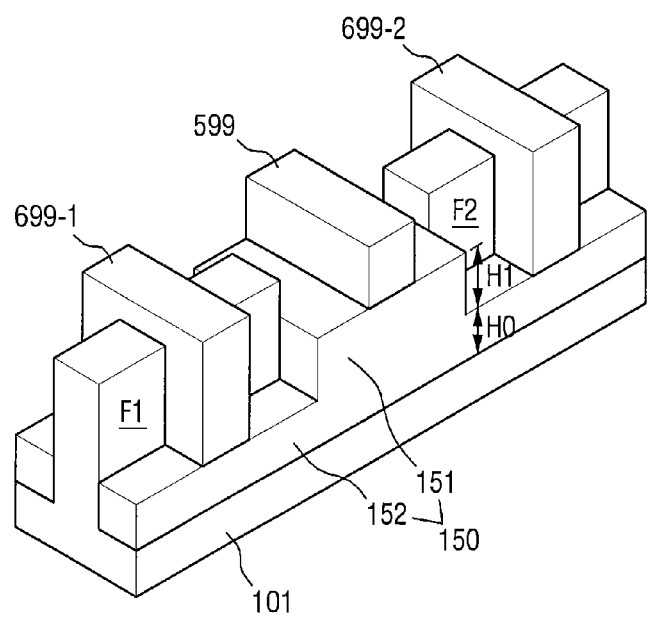
Figure 13C:
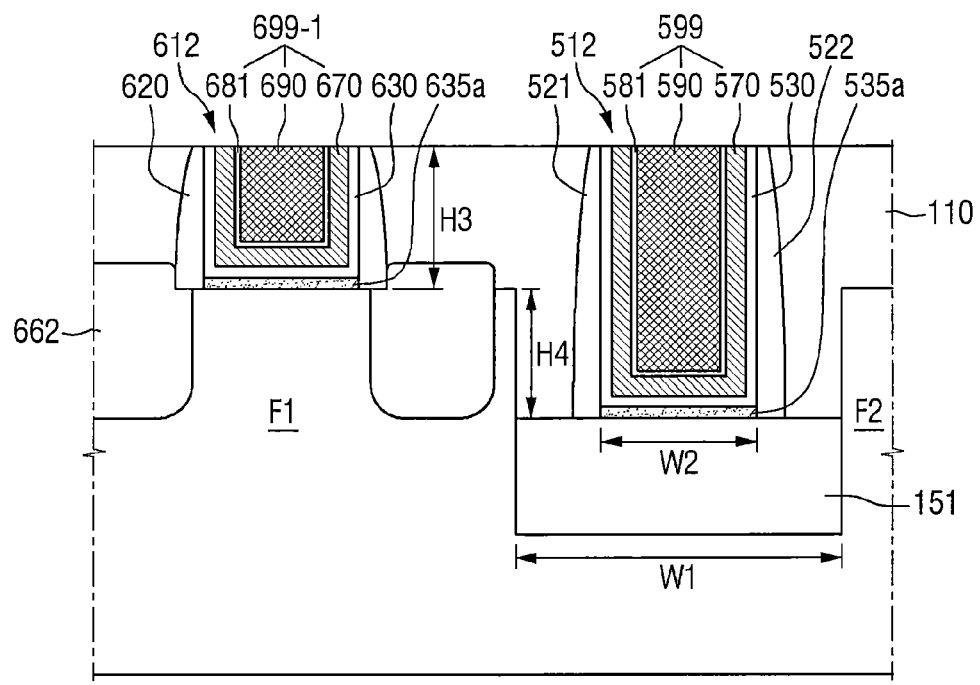
Figure 13D:
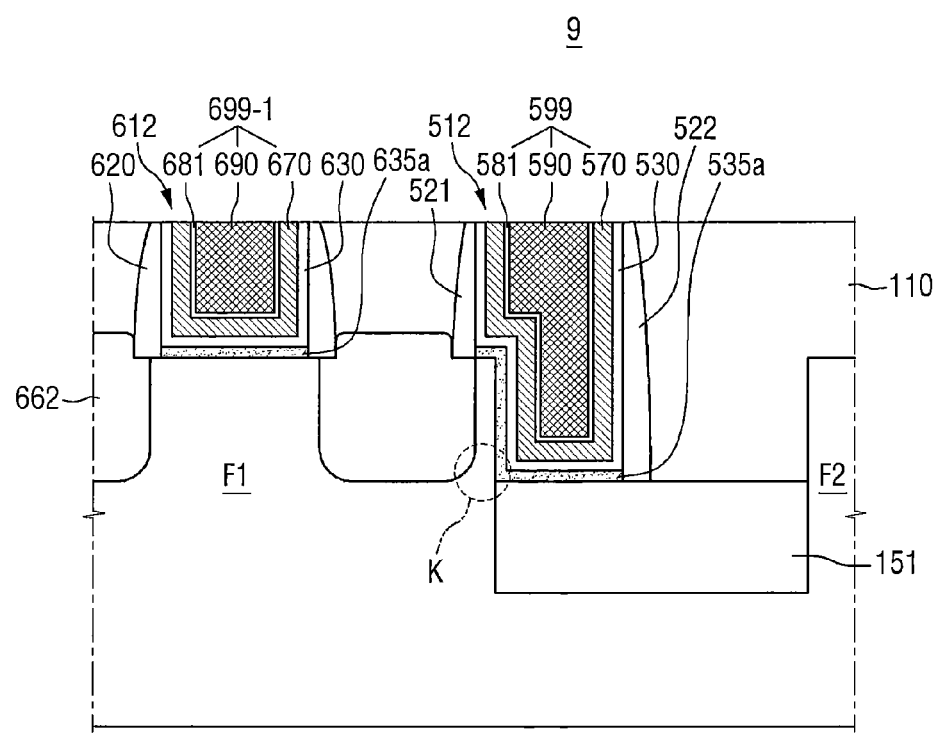

FIGS. 13A to 13D illustrates a semiconductor device according to some embodiments of the present inventive concept. Specifically, FIGS. 13A and 13B are a layout view and a conceptual perspective view of a semiconductor device according to a ninth embodiment of the present inventive concept, FIG. 13C is a cross-sectional view taken along the line C-C of FIG. 13A, and FIG. 13D is a cross-sectional view illustrating occurrence of misalignment.

First, referring to FIGS. 13A and 13B, a plurality of fins F1 and F2 may extend lengthwise. The fins F1 and F2 may be portions of a substrate 101 and may include epitaxial layers grown from the substrate 101.

In the illustrated embodiments, the fins F1 and F2 are shaped of rectangular parallepiped, but aspects of the present inventive concept are not limited thereto. That is to say, the fins F1 and F2 may be chamfered. That is to say, corner portions of the fins F1 and F2 may be rounded. Since the fins F1 and F2 are formed in a lengthwise direction, they may include long sides and short sides. Even if the corners of the fins F1 and F2 are rounded, it is obvious to one skilled in the art that the long sides and the short sides can be definitely distinguished from each other.

Channels may be connected to each other along three surfaces of the fins F1 and F2. Some embodiments provide that channels may be formed on facing surfaces of the fins F1 and F2.

The field insulating layer 150 may include a first part 151 and a first part 152 having different heights. The first part 152 may have a height H0 and the first part 151 may have a height (H0+H1). In detail, for example, the first part 151 may be formed to contact the short sides of the fins F1 and F2 and the first part 152 may be formed to contact the long sides of the fins F1 and F2. The first part 151 may be formed under a dummy gate 599 and the first part 152 may be formed under normal gates 699_1 and 699_2. In other words, a portion of the field insulating layer 150 (i.e., the first part 151) may be positioned between fins facing each other (e.g., between the fins F1 and F2).

The field insulating layer 150 may be an oxide film, a nitride film, an oxynitride film, or a combination thereof.

The interlayer dielectric layer 110 may be formed on the first fin F1, the second fin F2 and the field insulating layer 150. In addition, the interlayer dielectric layer 110 may include a first trench 612 exposing at least a portion of the first fin F1 and a second trench 512 exposing at least a portion of the field insulating layer 150.

A first normal gate 699_1 is disposed in the first trench 612. The first normal gate 699_1 may be substantially the same with, for example, the gate structure shown in FIG. 4, but aspects of the present inventive concept are not limited thereto. The first normal gate 699_1 may also be substantially the same with, for example, the gate structure shown in FIG. 3.

A deposition insulating layer 535a formed on the field insulating layer 150, a gate insulating layer 530 formed on the deposition insulating layer 535a, and a dummy gate 599 formed on the gate insulating layer 530, may be disposed in the second trench 512.

Meanwhile, a plurality of dummy gates 599 may be formed on a corresponding part of the field insulating layer 150 (i.e., on the first part 151 of the field insulating layer 150. In particular, each one of the plurality of dummy gates 599 may be formed on the corresponding first part 151. Since the dummy gates 599 are formed one by one, rather than two or more dummy gates 599 being formed, the layout size can be reduced.

In addition, as shown, a top surface of the first part 151 of the field insulating layer 150 may be lower than a top surface of the first fin F1 (or a top surface of the second fin F2).

In addition, as shown, a distance W1 between the first fin F1 and the second fin F2 may be greater than a width W2 of the dummy gate 599. Therefore, the dummy gate 599 may be positioned between the first fin F1 and the second fin F2. In detail, a first spacer 521 and a second spacer 522 may be disposed on both sidewalls of the dummy gate 599. Here, sidewalls of the first spacer 521 and the first fin F1 may be spaced apart from each other, and sidewalls of the second spacer 522 and the second fin F2 may be spaced apart from each other.

A height H3 ranging from the top surface of the first fin F1 to the top surface of the first normal gate 699_1 may be smaller than a height H4 ranging from the field insulating layer 150 (i.e., the first part 151) to the top surface of the first fin F1.

Meanwhile, a first elevated source/drain 662 formed in the first fin F1 may further be formed on opposite sides of the first normal gate 699_1.

When misalignment occurs, the dummy gate 599 may be disposed in such a manner as shown in FIG. 13D.

In such a case, the second trench 512 may expose not only a portion of the field insulating layer 150 but also a portion of the first fin F1. The deposition insulating layer 535a may be formed in the second trench 512 to be disposed on the field insulating layer 150 and on sidewalls of the first fin F1. The gate insulating layer 530 may be formed on the deposition insulating layer 535a. The dummy gate 599 may be formed on the gate insulating layer 530 to be disposed on the field insulating layer 150 and on the sidewalls of the first fin F1. As shown, the deposition insulating layer 535a may be formed to extend up to the top surface of the first fin F1.

In particular, the deposition insulating layer 535a may also be formed on the top surface of the field insulating layer 150. The deposition insulating layer 535a may prevent defects from occurring to a normal fin type transistor. In detail, the dummy gate 599 may be formed by a replacement process. That is to say, a sacrificial insulating layer (or a deposition insulating layer) is formed, an interlayer dielectric layer surrounding a sacrificial pattern is formed, and the sacrificial pattern is then removed to form a trench in the interlayer dielectric layer. An etching solution (e.g., an ammonia solution) may be used when removing the sacrificial pattern. If the sacrificial insulating layer (deposition insulating layer) does not cover the top surface of the field insulating layer 150 (specifically, a portion labeled "K" between the field insulating layer 150 and the first fin F1), the etching solution may penetrate into the portion K between the field insulating layer 150 and the first fin F1, thereby removing the sidewall of the first fin F1 and the elevated source/drain (e.g., eSD). However, in the semiconductor device 9 according to the ninth embodiment of the present inventive concept, since the deposition insulating layer 535a is formed on the top surface of the field insulating layer 150, it is possible to prevent the defects from being generated.

Figure 14A:
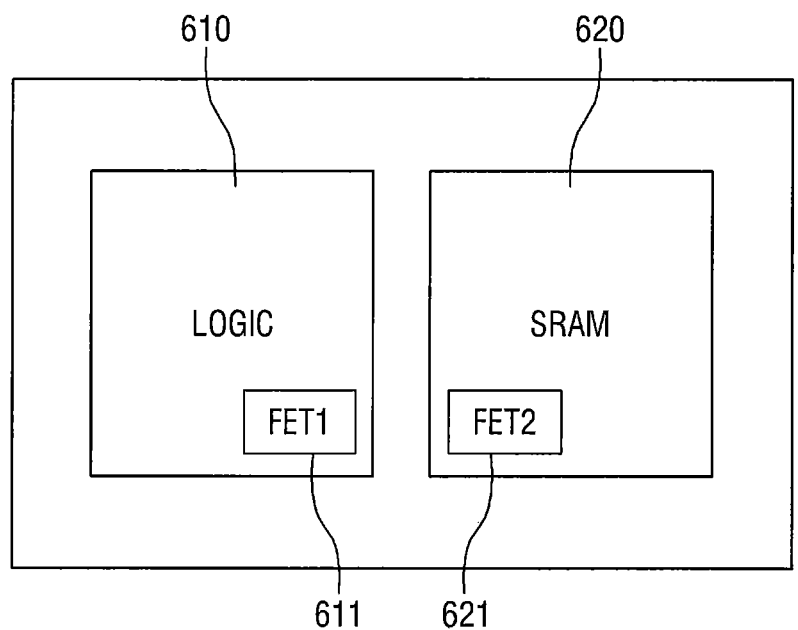
FIGS. 14A and 14B are conceptual diagrams illustrating semiconductor devices according to some embodiments of the present inventive concept.
Figure 14B:
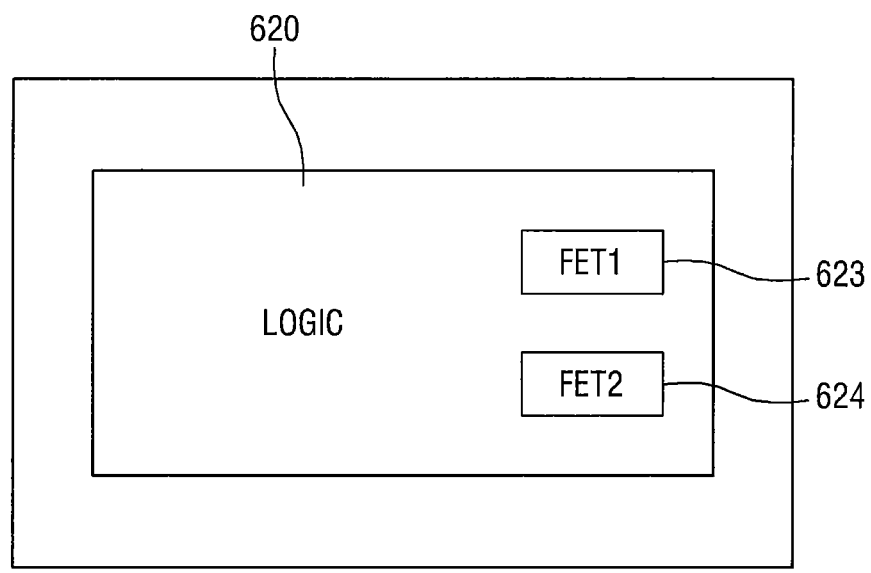

FIGS. 14A and 14B are conceptual diagrams illustrating semiconductor devices according to some different, respective, embodiments of the present inventive concept.

Referring first to FIG. 14A, in the semiconductor device 10 according to some embodiments of the present inventive concept, different transistors 621 and 611 may be formed in an SRAM region 620 and a logic region 610. For example, in the transistor 621 (see the third transistor 13 formed in the third region III of FIG. 7), a deposition insulating layer may not be present between a metal gate and a substrate (or a field insulating layer). In the transistor 611 (see the third transistor 11 formed in the first region I of FIG. 7), a deposition insulating layer may be present between a metal gate and a substrate (or a field insulating layer). The transistor 621 may be a transistor operating at a regular voltage and the transistor 611 may be a transistor operating at a high voltage.

Referring to FIG. 14B, in the semiconductor device 11 according to some embodiments of the present inventive concept, different transistors 623 and 624 may be formed in a logic region 620. As described above, the transistor 623 may be a transistor operating at a regular voltage and the transistor 624 may be a transistor operating at a high voltage.

Figure 15:
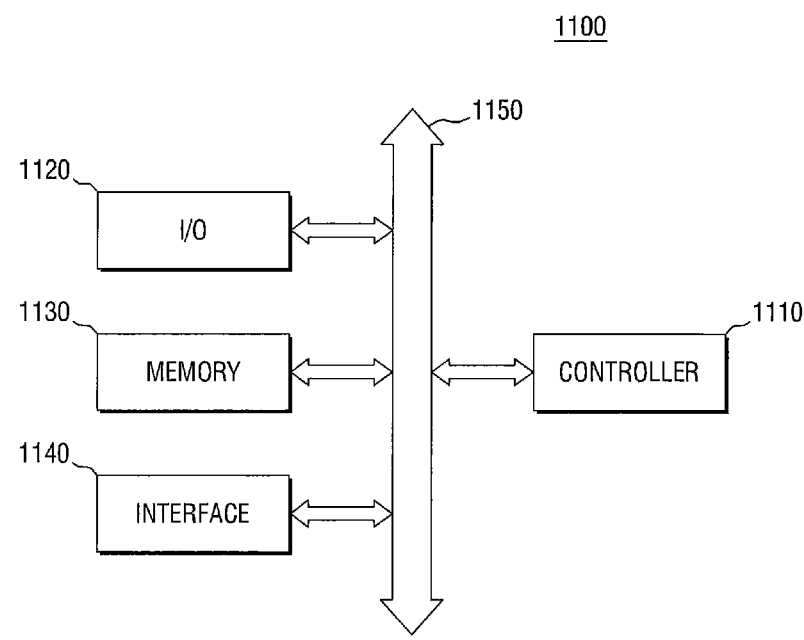
FIG. 15 is a block diagram of an electronic system including a semiconductor device according to some embodiments of the present inventive concept.

FIG. 15 is a block diagram of an electronic system including a semiconductor device according to some embodiments of the present inventive concept.

Referring to FIG. 15, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The semiconductor device according to some embodiments of the present inventive concept may be used in at least one of the logic blocks.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network and/or receiving data from the communication network. The interface 1140 may be wired or wireless. For example, the interface 1140 may include an antenna and/or a wired/wireless transceiver, and so on.

Although not shown, the electronic system 1100 may further include high-speed DRAM and/or SRAM as a working memory for improving the operation of the controller 1110. Fin electric field effect transistors according to some embodiments of the present inventive concept may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, and/or any type of electronic device capable of transmitting and/or receiving information in a wireless environment.

Hereinafter, fabricating methods of a semiconductor device according to some embodiments of the present inventive concept will be described with reference to FIGS. 16 to 21 and FIG. 7.

FIGS. 16 to 21 illustrate intermediate process steps in fabricating methods of a semiconductor device according to some embodiments of the present inventive concept as illustrated in FIG. 7.

Figure 16:
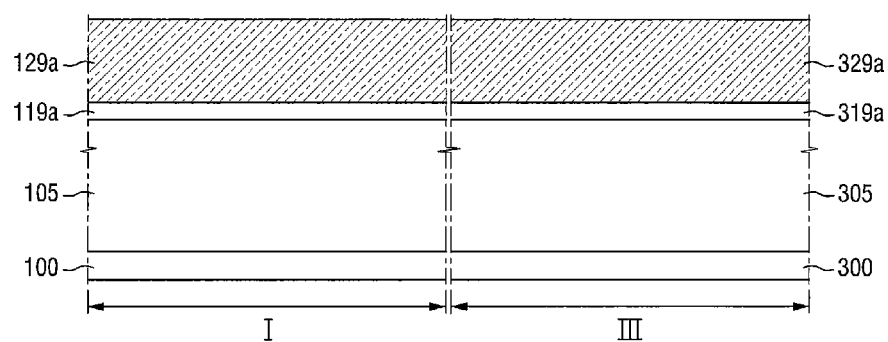
FIGS. 16 to 21 illustrate intermediate process steps in a fabricating method of the semiconductor device according to some embodiments of the present inventive concept.

Referring first to FIG. 16, substrates 100 and 300 may include a first region I and a third region III defined therein. That is to say, active regions are defined by forming field insulating layers 105 and 305 in the substrates 100 and 300.

Next, sacrificial insulating layers 119a and 319a are formed on the substrates 100 and 300 having the field insulating layers 105 and 305. Here, the sacrificial insulating layers 119a and 319a may be insulating layers formed by a deposition method. The deposition methods may include chemical vapor deposition (CVD) and/or atomic layer deposition (ALD), but aspects of the present inventive concept are not limited thereto.

Next, sacrificial gate layers 129a and 329a are formed on the sacrificial insulating layers 119a and 319a. The sacrificial gate layers 129a and 329a may be made of, for example, polysilicon, but aspects of the present inventive concept are not limited thereto.

Figure 17:
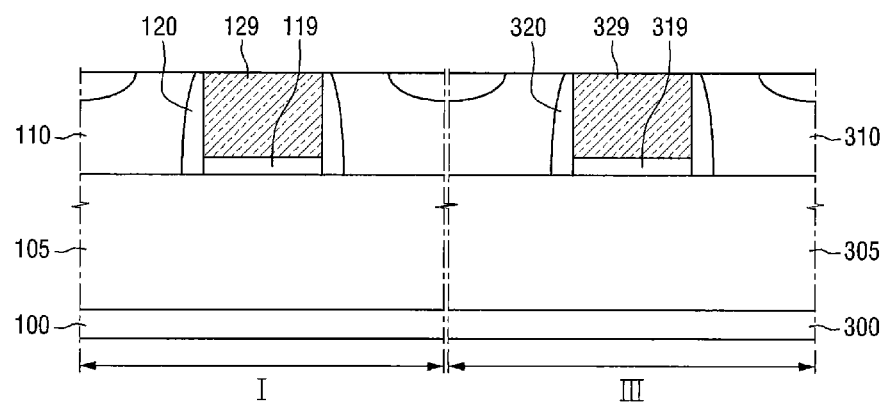

Referring to FIG. 17, the sacrificial gate layers 129a and 329a and the sacrificial insulating layers 119a and 319a are patterned, thereby forming a first sacrificial gate pattern 129 and a first sacrificial insulating pattern 119 in the first region I and forming a third sacrificial gate pattern 329 and a third sacrificial insulating pattern 319 in the third region III.

Next, interlayer dielectric layers 110 and 310 are formed to sufficiently surround the first sacrificial gate pattern 129, the first sacrificial insulating pattern 119, the third sacrificial gate pattern 329 and the third sacrificial insulating pattern 319. Next, the interlayer dielectric layers 110 and 310 are planarized to expose a top surface of the first sacrificial gate pattern 129 and a top surface of the third sacrificial gate pattern 329.

Figure 18:
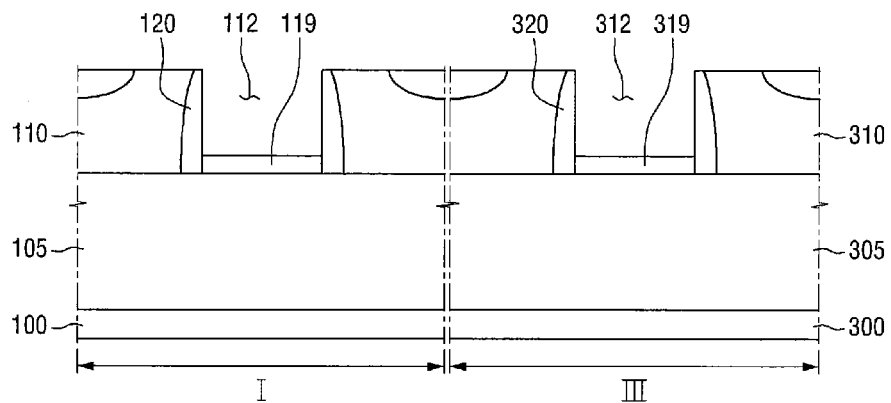

Referring to FIG. 18, the first and third sacrificial gate patterns 129 and 329 are removed to expose the first and third sacrificial insulating patterns 119 and 319.

Figure 19:
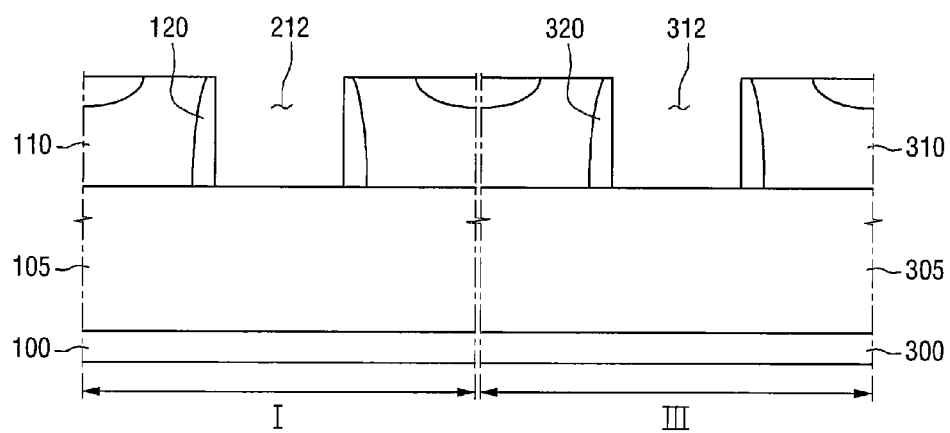

Referring to FIG. 19, the first and third sacrificial insulating patterns 119 and 319 are removed to expose top surfaces of the field insulating layers 105 and 305 and to form a first trench 112 and a third trench 312. Here, removing the first and third sacrificial insulating patterns 119 and 319 may be performed by, for example, wet etching. Since the first and third sacrificial insulating patterns 119 and 319 are formed by deposition, they can be easily removed without a residue. When an insulating pattern formed by a method different from the deposition method, such as a thermal process, a dual plasma using method, a UV plasma using method, or a peroxide using method, is removed, the residue may be generated. The residue may become a defect in a subsequent process and may deteriorate operating characteristics of the semiconductor device.

Figure 20:
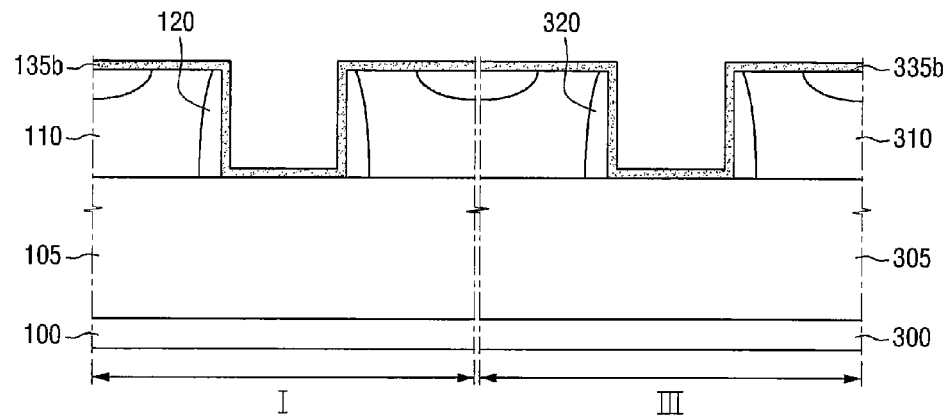

Referring to FIG. 20, deposition insulating layers 135b and 335b are conformally formed along top surfaces of the interlayer dielectric layers 110 and 310, sidewalls and bottom surface of the first trench 112, and sidewalls and bottom surface of the third trench 312. The deposition method may include chemical vapor deposition (CVD) or atomic layer deposition (ALD), but aspects of the present inventive concept are not limited thereto.

Figure 21:
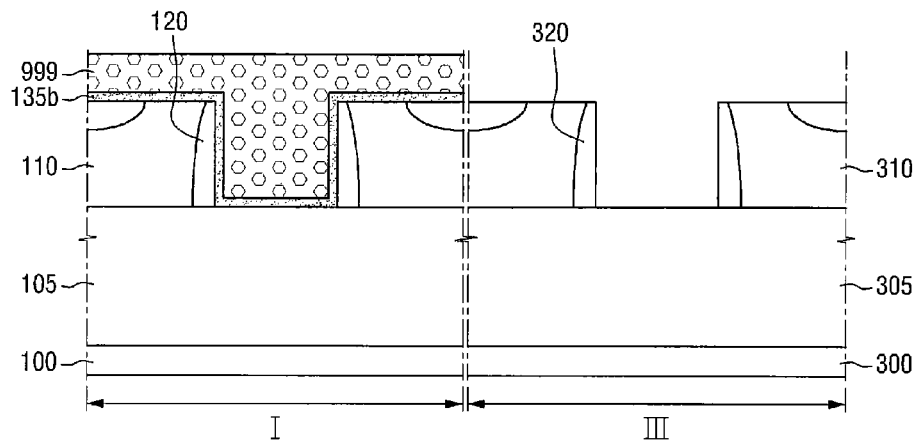

Referring to FIG. 21, a mask 999 covering the first region I while exposing the third region III is formed, and the deposition insulating layer 335b formed in the third region III is removed. The removing of the deposition insulating layer 335b may be performed by, for example, wet etching. Since the deposition insulating layer 335b is formed by the deposition method, it can be easily removed without a residue. When an insulating pattern formed by a method different from the deposition method, such as a thermal process, a dual plasma using method, a UV plasma using method, or a peroxide using method, is removed, the residue may be generated. Next, the mask 999 is removed.

Referring back to FIG. 7, a high-k material layer, a metal layer for forming an N type work function control film, a metal layer for forming an adhesive film, and/or a metal layer for forming a metal gate pattern, are sequentially formed on the resultant product shown in FIG. 21, and planarization is performed thereon to expose top surfaces of the interlayer dielectric layers 110 and 310. As the result, the first metal gate pattern 190, the first adhesive film 181, the N type work function control film 170 and the first gate insulating layer 130 are formed in the first region I, and the third metal gate pattern 390, the third adhesive film 381, the N type work function control film 370 and the third gate insulating layer 330 are formed in the third region III.

Figure 22:
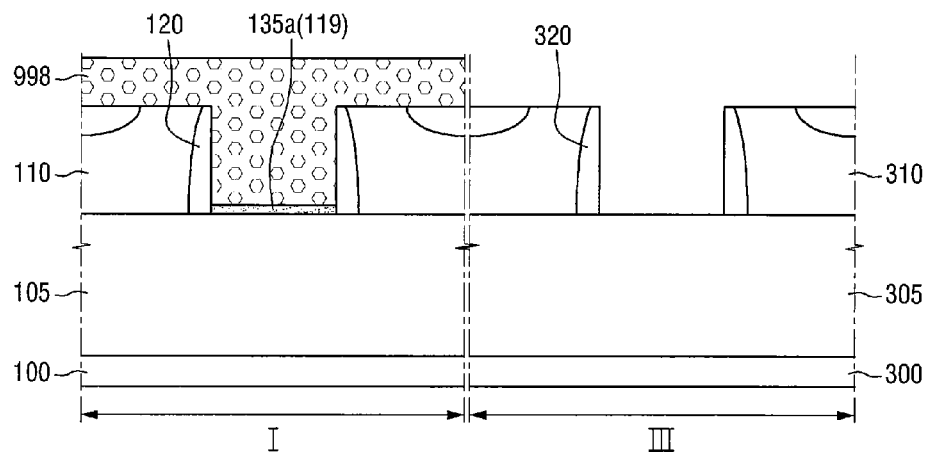
FIG. 22 illustrates intermediate process operations in fabricating methods of the semiconductor device according to some embodiments of the present inventive concept.

FIG. 22 illustrates intermediate process steps in fabricating methods of a semiconductor device according to some embodiments of the present inventive concept as illustrated in FIG. 8. For the sake of convenient explanation, the following description will focus on differences between the fabricating methods according to embodiments illustrated in FIGS. 7 and 8. In detail, in the fabricating method of the semiconductor device according to the sixth embodiment of the present inventive concept, the intermediates process steps shown in FIGS. 16 to 18 are the same as those of the fabricating method of the semiconductor device according to those corresponding to embodiments illustrated in FIG. 7.

As shown in FIG. 16, the sacrificial insulating layers 119a and 319a and the sacrificial gate layers 129a and 329a are formed on the substrates 100 and 300.

Next, as shown in FIG. 17, an etching process is performed to form the first sacrificial gate pattern 129, the first sacrificial insulating pattern 119, the third sacrificial gate pattern 329, and the third sacrificial insulating pattern 319. The interlayer dielectric layers 110 and 310 are formed in vicinity of the first sacrificial gate pattern 129, the first sacrificial insulating pattern 119, the third sacrificial gate pattern 329 and the third sacrificial insulating pattern 319.

Next, as shown in FIG. 18, the first and third sacrificial gate patterns 129 and 329 are removed.

Referring to FIG. 22, a mask 998 covering the first region I while exposing the third region III is formed, and the third sacrificial insulating pattern 319 formed in the third region III is removed. The removing of the third sacrificial insulating pattern 319 may be performed by, for example, wet etching. Since the third sacrificial insulating pattern 319 is formed by the deposition method, it can be easily removed without a residue. When an insulating pattern formed by a method different from the deposition method, such as a thermal process, a dual plasma using method, a UV plasma using method, or a peroxide using method, is removed, the residue may be generated. The first sacrificial insulating pattern 119 remains in the first region I. The first sacrificial insulating pattern 119 is used as the first deposition insulating layer 135a described with reference to FIG. 8.

Next, referring to FIG. 8, a high-k material layer, a metal layer for forming an N type work function control film, a metal layer for forming an adhesive film, and a metal layer for forming a metal gate pattern, are sequentially formed on the resultant product shown in FIG. 22, and planarization is performed thereon to expose top surfaces of the interlayer dielectric layers 110 and 310. As the result, the first metal gate pattern 190, the first adhesive film 181, the N type work function control film 170 and the first gate insulating layer 130 are formed in the first region I, and the third metal gate pattern 390, the third adhesive film 381, the N type work function control film 370 and the third gate insulating layer 330 are formed in the third region III.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
   a fin protruded from a substrate;
   a field insulation layer disposed on the substrate;
   a first gate disposed on the fin; and
   a source/drain region between the first gate and the field insulation layer; and
   a second gate disposed on the field insulation layer,
   wherein a first distance between a bottom surface of the source/drain region and a top surface of the source/drain region is greater than a second distance between a top surface of the field insulation layer and a top surface of the fin, and the second distance is greater than a third distance between a top surface of the source/drain region to a top surface of the first gate.

2. The semiconductor device of claim 1, wherein the first gate includes a metal gate pattern and a work function control film covering at least a bottom and both opposite sides of the metal gate pattern.

3. The semiconductor device of claim 2, further comprising a gate insulating layer disposed between the work function control film and the top surface of the fin.

4. The semiconductor device of claim 1, wherein the substrate is a group III-V substrate.

5. The semiconductor device of claim 1, wherein the source/drain region includes SiGe.

6. The semiconductor device of claim 1, wherein the first gate is a normal gate and the second gate is a dummy gate.

7. A semiconductor device comprising:
   a fin protruded from a substrate;
   a field insulation layer disposed on the substrate;
   a first gate disposed on the fin;

a source/drain region between the first gate and the field insulation layer; and a second gate disposed on the field insulation layer, wherein a first distance between a bottom surface of the source/drain region and a top surface of the source/drain region is greater than a second distance between the bottom surface of the source/drain region and a top surface of the fin, and the second distance is greater than a third distance between a bottom surface of the first gate to a top surface of the first gate.

8. The semiconductor device of claim 7, wherein the first gate includes a metal gate pattern and a work function control film covering at least a bottom and both opposite sides of the metal gate pattern.

9. The semiconductor device of claim 8, further comprising a gate insulating layer disposed between the work function control film and the top surface of the fin.

10. The semiconductor device of claim 7, wherein the substrate is a group III-V substrate.

11. The semiconductor device of claim 7, wherein the source/drain region includes SiGe.

12. The semiconductor device of claim 7, wherein the first gate is a normal gate and the second gate is a dummy gate.

* * * * *